(12) United States Patent
Inoue et al.

(10) Patent No.: US 6,998,679 B2
(45) Date of Patent: Feb. 14, 2006

(54) SEMICONDUCTOR DEVICE AND METHOD OF FABRICATING THE SAME

(75) Inventors: Kazutaka Inoue, Yamanashi (JP); Hitoshi Haematsu, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 10/348,779

(22) Filed: Jan. 23, 2003

(65) Prior Publication Data
US 2003/0183886 A1 Oct. 2, 2003

(30) Foreign Application Priority Data
Mar. 29, 2002 (JP) .............................. 2002-098033

(51) Int. Cl.
*H01L 29/812* (2006.01)
(52) U.S. Cl. ........................ 257/340; 257/409; 257/630
(58) Field of Classification Search ................ 257/340, 257/409, 630; 438/167
See application file for complete search history.

(56) References Cited

U.S. PATENT DOCUMENTS 5,252,848 A * 10/1993 Adler et al. ................. 257/328
6,504,190 B1 * 1/2003 Haematsu ..................... 257/283
2002/0033508 A1 * 3/2002 Morikawa et al. ........... 257/368
2002/0053699 A1 * 5/2002 Kim et al. .................... 257/343

FOREIGN PATENT DOCUMENTS

| JP | 3-35536 | 2/1991 |
| JP | 6-349859 | 12/1994 |
| JP | 11-168099 | 6/1999 |
| JP | 2002-110700 | 4/2002 |

OTHER PUBLICATIONS

A. Wood et al, High Performance Silicon LDMOS Technology for 2GHz RF Power Amplifier Applications. IEDM 1996, pp. 87-90.*

* cited by examiner

*Primary Examiner*—Anh Duy Mai
(74) *Attorney, Agent, or Firm*—Armstrong, Kratz, Quintos, Hanson & Brooks, LLP (57) ABSTRACT

A semiconductor device includes a gate electrode on a semiconductor substrate, a source electrode and a drain electrode that are provided on the semiconductor substrate, the gate electrode being interposed between the source electrode and the drain electrode, an insulating layer covering the gate electrode, and a source wall that extends from the source electrode and passes over the gate electrode, an end surface of the source wall being interposed between the gate electrode and the drain electrode and being located in a position lower than a top surface of the gate electrode.

10 Claims, 6 Drawing Sheets

SEMICONDUCTOR DEVICE AND METHOD OF FABRICATING THE SAME

BACKGROUND OF THE INVENTION

1. Field of the Invention

The present invention generally relates to semiconductor devices and methods of fabricating these devices, and more particularly, to a semiconductor device for use in high-frequency amplification and a method of fabricating the same.

2. Description of the Related Art

Figure 1:
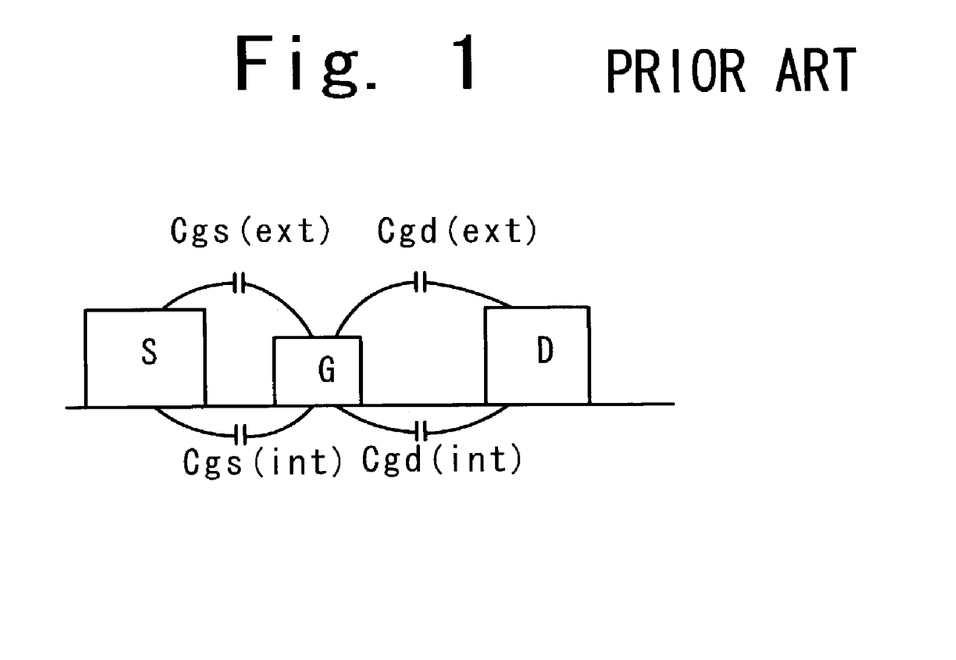
FIG. 1 illustrates parasitic capacitances formed around electrodes of a transistor.

A field effect transistor is known as a semiconductor device suitable for amplification in a high-frequency band such as a microwave band, semi-millimeter wave band or millimeter band. A parasitic capacitance between the source and gate of the transistor and another parasitic capacitance between the drain and gate thereof serve as factors that prevents high-frequency operations. These parasitic capacitances are classified into intrinsic capacitance and extrinsic capacitance. FIG. 1 shows intrinsic and extrinsic capacitance. Cgs(int) and Cgd(int) denote gate-source intrinsic capacitance and gate-drain intrinsic capacitance, respectively. These capacitances are formed inside a semiconductor substrate 10. Cgs(ext) and Cgd(ext) denote gate-source extrinsic capacitance and gate-drain extrinsic capacitance, respectively. These capacitances are formed outside of the semiconductor substrate 10. It is desired to reduce the parasitic capacitances as small as possible in order to achieve high-frequency operation.

The extrinsic capacitances Cgs(ext) and Cgd(ext) are relatively large. Therefore, it is particularly desired to reduce the extrinsic capacitances. The extrinsic capacitances may be reduced by designing layout so that no member having a high dielectric constant exists in the vicinity of the gate electrode. A proposal based on the viewpoint mentioned above is described in, for example, Japanese Unexamined Patent Publication No. 3-35536. According to the proposal, a gap is defined around the gate electrode, and a shield electrode is provided around the gate electrode via the gap.

However, a complex production process is needed to define the gap around the gate electrode. Further, the gap may weaken the mechanical strength of the layer structure. For example, external shock applied to the device may easily destroy the gap and short-circuit the shield electrode and the gate electrode.

SUMMARY OF THE INVENTION

Taking into consideration the above, the present invention provides a novel semiconductor device and a method of fabricating the same taking into consideration the above.

An object of the present invention is to provide a semiconductor device having a structure that needs no complex process and has enhanced mechanical strength and reduced inter-electrode parasitic capacitance.

According to an aspect of the present invention, there is provided a semiconductor device comprising: a gate electrode on a semiconductor substrate; a source electrode and a drain electrode that are provided on the semiconductor substrate, the gate electrode being interposed between the source electrode and the drain electrode; an insulating layer covering the gate electrode; and a source wall that extends from the source electrode and passes over the gate electrode, an end surface of the source wall being interposed between the gate electrode and the drain electrode and being located in a position lower than a top surface of the gate electrode.

According to another aspect of the invention, there is provided a method of fabricating a semiconductor device comprising the steps of: (a) forming an insulating layer that covers a gate electrode on a semiconductor substrate and its vicinity; (b) providing a resist over the semiconductor substrate, the resist being located between a drain electrode and a source electrode that are provided on the semiconductor substrate; (c) forming a conductor layer over the semiconductor substrate so as to connect the source electrode; (d) removing the resist to form a source wall that extends from the source electrode and passes over the gate electrode, an end surface of the source wall being interposed between the gate electrode and the drain electrode and being located in a position lower than a top surface of the gate electrode.

According to yet another aspect of the present invention, there is provided a method of fabricating a semiconductor device comprising the steps of: (a) forming an insulating layer that covers a gate electrode on a semiconductor substrate and its vicinity; (b) providing a first resist on the semiconductor substrate and patterning it; (c) providing a second resist having a first part over the first resist and a second part between the gate electrode and the source electrode; (d) forming a conductor layer over the semiconductor substrate so as to connect the source electrode; and (e) removing the first and second resists to form a source wall that extends from the source electrode and passes over the gate electrode, an end surface of the source wall being interposed between the gate electrode and the drain electrode and being lower than a top surface of the gate electrode.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description is now described of embodiments of the present invention with reference to the accompanying drawings.

Figure 2A:
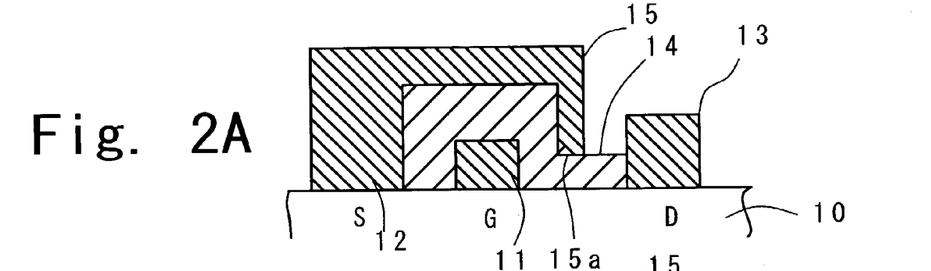
FIG. 2A is a cross-sectional view of a semiconductor device according to an embodiment of the present invention.
Figure 2B:
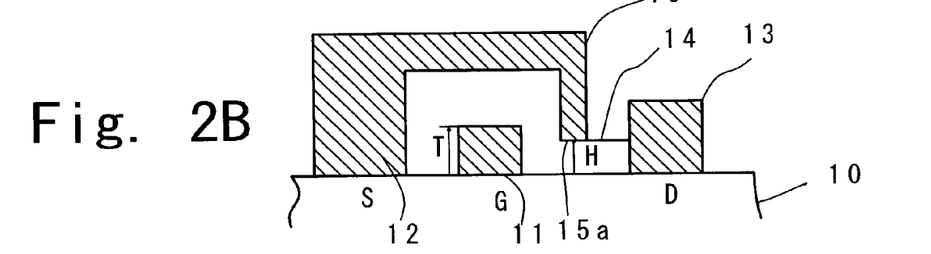
FIG. 2B shows the relationship between the height of a gate electrode and the distance between an end surface of a source wall and the surface of a substrate.

FIGS. 2A and 2B are cross-sectional views of a semiconductor device according to a first embodiment of the present invention. The device includes a gate electrode 11, a source electrode 12 and a drain electrode 13, all of which are formed on a semiconductor substrate 10 of, for example, silicon or a compound semiconductor substrate of, for example, GaAs. The gate electrode 11 is interposed between the source electrode 12 and the drain electrode 13. The semiconductor device includes an insulating layer 14, which covers the gate electrode 11. Further, the semiconductor device includes a source wall 15, which extends from the source electrode 12 and passes over the gate electrode 11. The source wall 15 ends between the gate electrode 11 and the drain electrode 13. An end surface 15a of the source wall 15, which is interposed between the gate electrode 11 and the drain electrode 13, is located in a position lower than the top surface of the gate electrode 11. The end surface 15a of the source wall 15 faces the surface of the substrate 10. As is shown in FIG. 2B, the position mentioned above satisfies T>H where T is the height of the gate electrode 11 measured from the surface of the semiconductor substrate 10 (this surface is defined as a reference plane) and H is the distance between the reference plane and the end surface 15a of the source wall 15. Since the source wall 15 extending from the source electrode 12 is positioned between the gate electrode 11 and the drain electrode 13, the potential of the source electrode 12 is given between the gate electrode 11 and the drain electrode 13. It is therefore possible to block electric lines of force between the gate electrode 11 and the drain electrode 13 and to effectively reduce the gate-drain extrinsic capacitance Cgd(ext). It can be seen from the above description, the source wall 15 serves as a shield layer.

The parameters T and H may be determined taking into account the following. As the difference between T and H increases, the end surface 15a of the source wall 15 becomes closer to the surface of the semiconductor substrate 10 so that the blocking of electric lines of force can be enhanced. In contrast, the end surface 15a of the source wall 15 operatively becomes close to the drain electrode 13 to which a comparatively high voltage is applied by reducing the distance between the end surface 15a and the substrate surface, the insulating layer 14 just below the end surface 15a becomes thinner. Thus, the thinner portion of the insulating layer 14 may be broken down due to the function of the electric lines of force. On the contrary, as the difference between T and H decreases, the blocking effect is weakened. Consequently, the upper limit of the difference between T and H is preferably determined so as not to go beyond the breakdown voltage of the insulating layer 14, and the lower limit thereof is preferably determined so as to secure a desired degree of blocking.

Figure 2C:
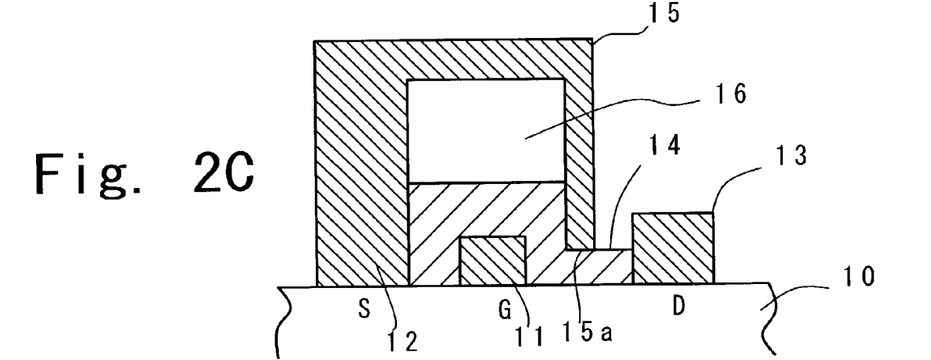
FIG. 2C is a cross-sectional view of a semiconductor device according to another embodiment of the present invention.

The gate electrode 11 is covered by the insulating layer 14, on which the source wall 15 is provided, as shown in FIG. 2A. It is to be noted that there is no gap around the gate electrode 11. Thus, the layer structure of FIG. 2A has improved mechanical strength. Even if external shock is applied to the device, the source wall 15 serving as the shield layer may merely be deformed, and does not contact the gate electrode 11. In order to reduce the parasitic capacitance Cgs(ext) between the gate electrode 11 and the source electrode 12, as shown in FIG. 2C, a gap 16 may be provided between the insulating layer 14 that covers the gate electrode 11 and the source wall 15. Even if the source wall 15 is deformed due to external shock, the source wall 15 will not brought into contact with the gate electrode 11 because the insulating layer 14 covers the gate electrode 11 so that no short-circuit develops.

In the structure shown in FIG. 2A, the source wall 15 includes a step portion (having an L-shaped cross section) along the gate electrode 11. The source wall 15 is provided so as to completely enclose the gate electrode 11. This structure results in a high shield effect between the gate electrode 11 and the source electrode 12.

In the structure shown in FIG. 2C, the inner surface of the source wall 15 has a step-like portion along the gate electrode 11 so that the source wall 15 completely encloses the gate electrode 11. This structure results in a high shield effect between the gate electrode 11 and the source electrode 12.

The insulating layer 14 has a step portion (having an L-shaped cross section) along the shape of the gate electrode 11, so that the source wall 15 has a similar shape and completely encloses the gate electrode 11.

Figure 2D:
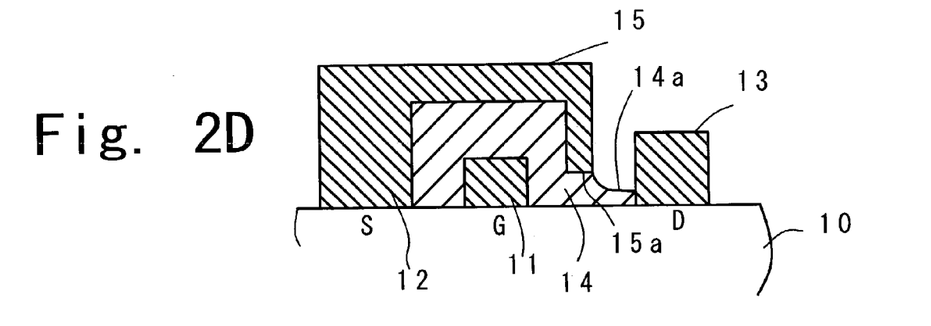
FIG. 2D is a cross-sectional view of a semiconductor device according to yet another embodiment of the present invention.

The end surface 15a of the source wall 15 is provided on the insulating layer 14. It is therefore possible to accurately define the difference between T and H with ease. That is, the difference T–H can be adjusted by controlling the thickness of the insulating layer 14. In order to realize T>H, the top surface of the insulating layer 14 is made lower than the top of the gate electrode 11. This is done by making the insulating layer 14 between the gate electrode 11 and the drain electrode 13 thinner than the gate electrode 11 having the thickness T. As shown in FIG. 2D, it is possible to make a portion 14a of the insulating layer 14 that does not contact the source wall 15 thinner than the other portion thereof that contacts the source wall 15. This causes the dielectric constant of the dielectric member (which is the insulating layer 14) between the gate electrode 11 and the drain electrode 13 to be close to 1, so that the electric lines of force between the end surface 15a of the source wall 15 and the surface of the semiconductor substrate 10 can be reduced.

A description will now be given, with reference to FIGS. 3A through 3E, of a method of fabricating the semiconductor device shown in FIG. 2A.

Figure 3A:
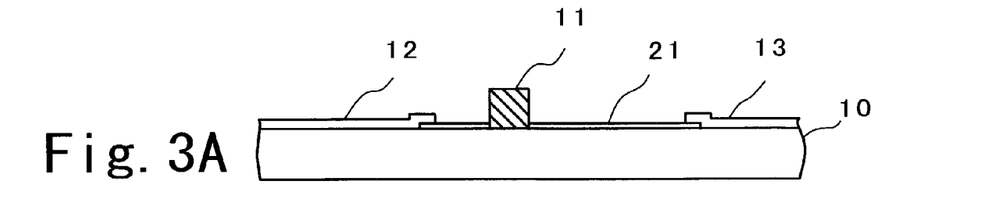
FIGS. 3A through 3E are cross-sectional views of steps of a method of fabricating the device shown in FIG. 2A
Figure 3B:
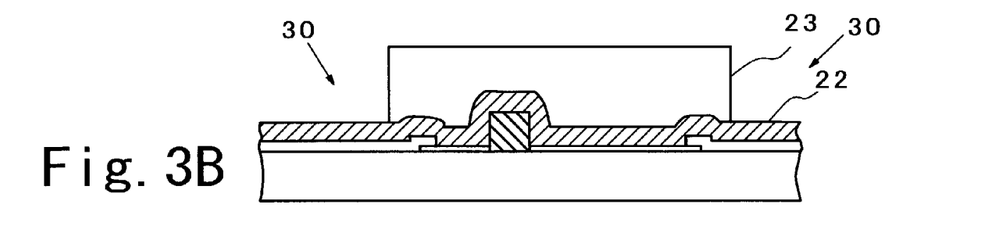

First, a semiconductor bulk shown in FIG. 3A is formed. The bulk has the semiconductor substrate 10, on which an insulating layer 21, the gate electrode 11, the source electrode 12 and the drain electrode 13 are formed. Next, as shown in FIG. 3B, an insulating layer 22 is formed on the entire surface of the bulk. The insulating layer will be shaped into the insulating layer 14 later. The insulating layer 22 may, for example, be silicon oxide ($SiO_2$) and have a thickness of, for example, 600 nm. As has been described previously, the insulating layer 22 should be thinner than the gate electrode 11 so that T–H>0 can be satisfied. Besides $SiO_2$, an insulating material of SiN, SiON, polyimide, or BCB (Benzocyclobutene) may be used. Then, resist 23 is deposited on the insulating layer 22 and is then patterned so as to have windows 30. The windows 30 are used for patterning the insulating layer 22 to expose the source electrode 12 and the drain electrode 13.

Then, the insulating layer 22 is etched via the windows 30. Preferably, this etching is anisotropic etching such as dry etching. When the insulating layer 22 is made of $SiO_2$, a fluorine gas such as SF6 may be used. Then, the resist 23 is removed, so that the insulating layer 14 shown in FIG. 3C can be formed.

Figure 3C:
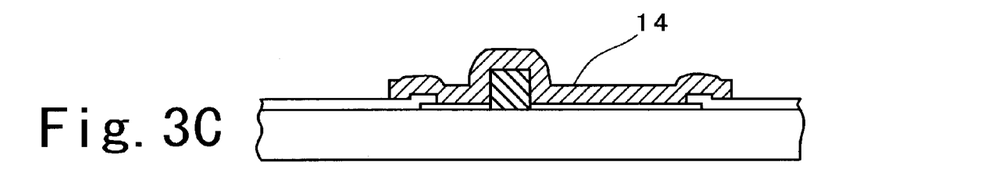
Figure 3D:
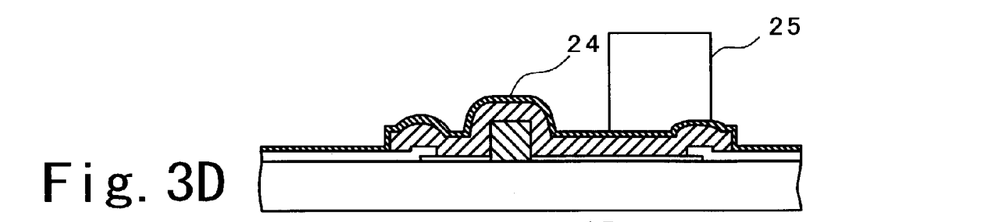

Thereafter, as shown in FIG. 3D, a metal layer 24 is deposited on the entire surface. The metal layer 24 is a seed metal for forming an interconnection pattern of gold (Au) that will be described later. The metal layer 24 may be deposited by sputtering or evaporation. When coverage of the metal layer 24 should be considered, it is preferable to deposit the metal layer 24 by sputtering. The metal layer 24 is, for example, Au. The metal layer 24 may have a multi-layer structure. A barrier metal such as titanium tungsten (TiW) may underlie the Au layer. The thickness of the metal layer 24 may be such that TiW/Au=100/100 nm. Then, a mask 25 for patterning of the metal layer 24 and subsequent Au plating are provided as shown in FIG. 3D.

Figure 3E:
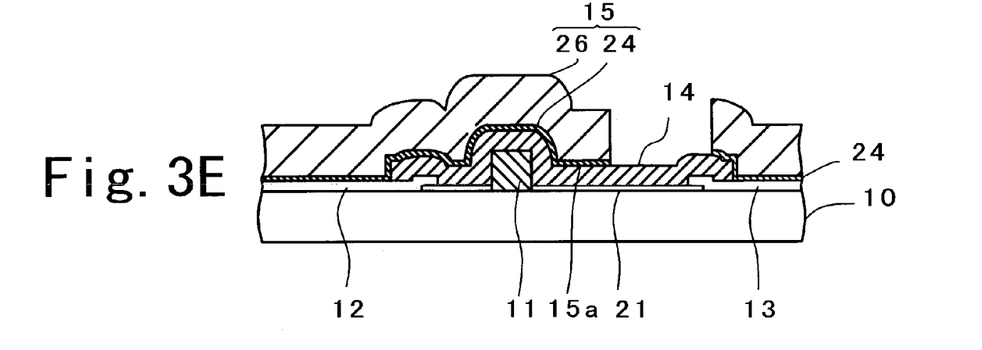

Then, as shown in FIG. 3E, a conductor layer 26 of Au is deposited on the entire surface by electrolytic plating. Au is deposited on the portions that are not covered by the mask 25. The conductor layer 26 is deposited to a thickness of, for example, 0.5–1.0 μm. Then, the mask 25 is removed by, for example, wet etching using a solution for peeling. Finally, the metal layer 24 exposed by removal of the mask is removed by etching. Au may be removed by argon (Ar) milling, and TiW may be removed by dry etching using a fluorine gas.

Figure 4:
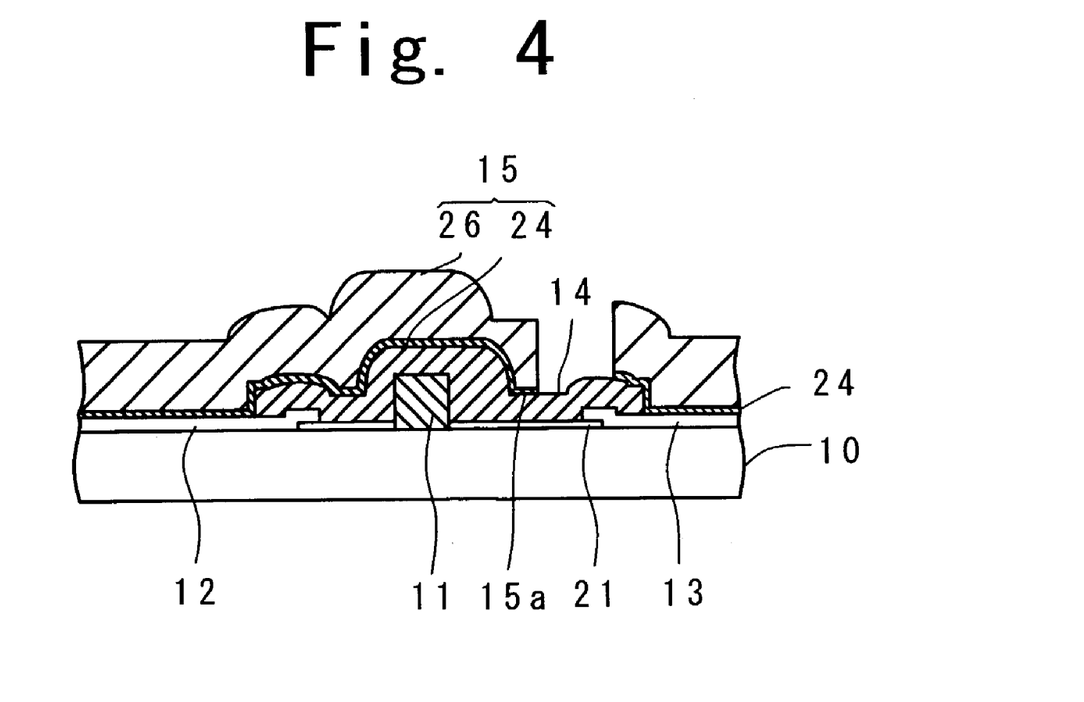
FIG. 4 is a cross-sectional view of a variation of the device shown in FIG. 2A.

The metal layer 24 and the conductor layer 26 define the source wall 15. That is, the source wall 15 has a multilayer structure composed of layers laminated. In the case of FIG. 3E, the source wall 15 is a two-layer structure. In FIG. 2, the source electrode 12 and the source wall 15 are integrally illustrated for the sake of simplicity. However, in practice, as shown in FIG. 3E, the source electrode 12 and the source wall 15 are physically individual layers. The source electrode 12 and the source wall 15 are electrically connected. From this viewpoint, it can be said that the source wall 15 is part of the source electrode. As shown in FIG. 3E, the end surface 15a of the source wall 15 is interposed between the gate electrode 11 and the drain electrode 13, and is located at a level lower than the top surface of the gate electrode 11. In FIG. 3E, the end surface 15a of the source wall 15 is closer to the gate electrode 11 than the drain electrode 13. Alternatively, as is shown in FIG. 4, the end surface 15a may be closer to the drain electrode 13 than the gate electrode 11, so that direct coupling between the gate and drain can be relaxed more effectively.

It can be seen from the above that the structure of FIG. 2A can be realized by the simple fabrication method.

In short, the method of fabricating the semiconductor device shown in FIGS. 3A through 3E includes the steps of: (a) forming the insulating layer 14 that covers the gate electrode 11 on the semiconductor substrate 10 and its vicinity; (b) providing the resist 25 over the semiconductor substrate 10, the resist being located between the drain electrode 13 and the source electrode 12 that are provided on the semiconductor substrate 10; (c) forming the conductor layer 26 over the semiconductor substrate 10 so as to connect the source electrode 12; (d) removing the resist 25 to form the source wall 15 that extends from the source electrode 12 and passes over the gate electrode 11, the end surface 15a of the source wall 15 being located between the gate electrode 11 and the drain electrode 13 and being lower than the top surface of the gate electrode 11.

A description will now be given, with reference to FIGS. 5A through 5F, and 6, of a method of fabricating the semiconductor device shown in FIG. 2C.

Figure 5A:
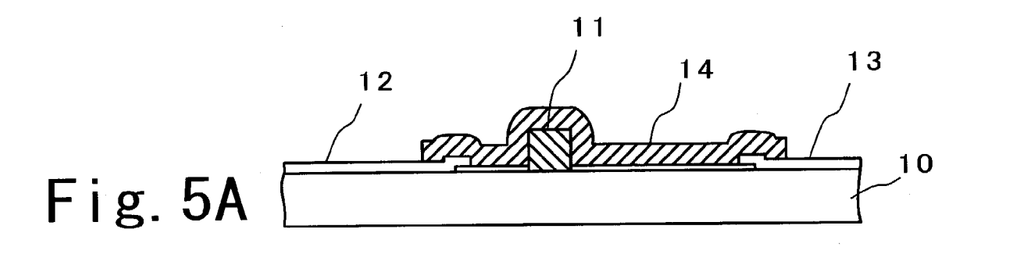
FIGS. 5A through 5F are cross-sectional views of steps of a method of fabricating the device shown in FIG. 2C.

FIG. 5A is the same as FIG. 3C. The bulk shown in FIG. 5A is produced by the steps of FIGS. 3A and 3B.

Figure 5B:
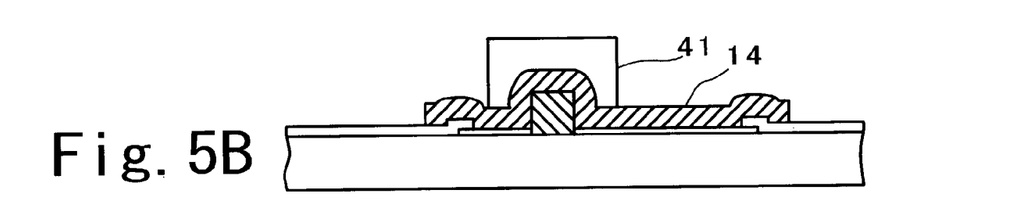

Next, as shown in FIG. 5B, a resist 41 for forming the aforementioned gap (hollow portion) 16 is provided on the insulating layer 14 and is patterned.

Figure 5C:
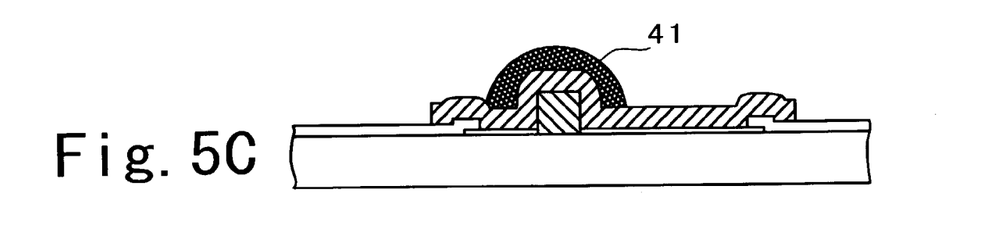

Then, as shown in FIG. 5C, the resist 41 is subject to a thermal process and a subsequent ultraviolet curing process. The resist 41 shown in FIG. 5B curls up by the thermal process, so that it can be given heat resistance in the ultraviolet curing process.

Figure 5D:
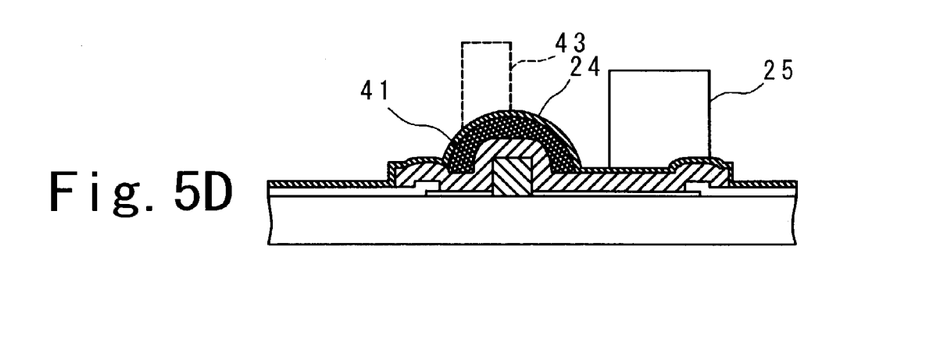

Thereafter, as shown in FIG. 5D, the mask 25 that is the same as that shown in FIG. 3D is formed. Additionally, the mask 43 of resist is formed to form a window 44 in the conductor layer 26 of Au, as shown in FIG. 5E.

Figure 5E:
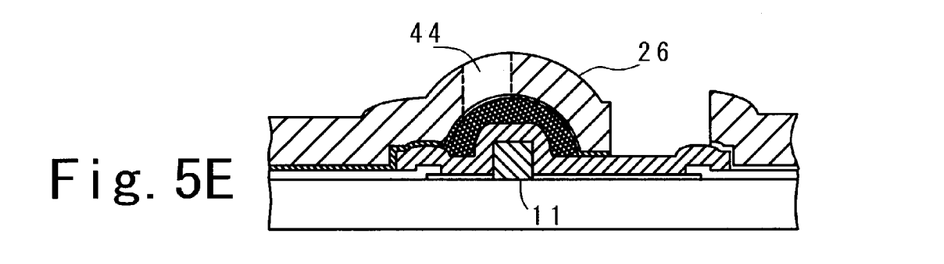

Then, as shown in FIG. 5E, the conductor layer 26 of Au is deposited and the masks 25 and 43 are removed. Removal of the mask 43 defines a window 44 in the conductor layer 26 positioned above the gate electrode 11. Subsequently, the portions of the metal layer 24 that are exposed by removal of the masks 25 and 43 are removed by etching. The resist 41 is exposed via the window 44.

Figure 5F:
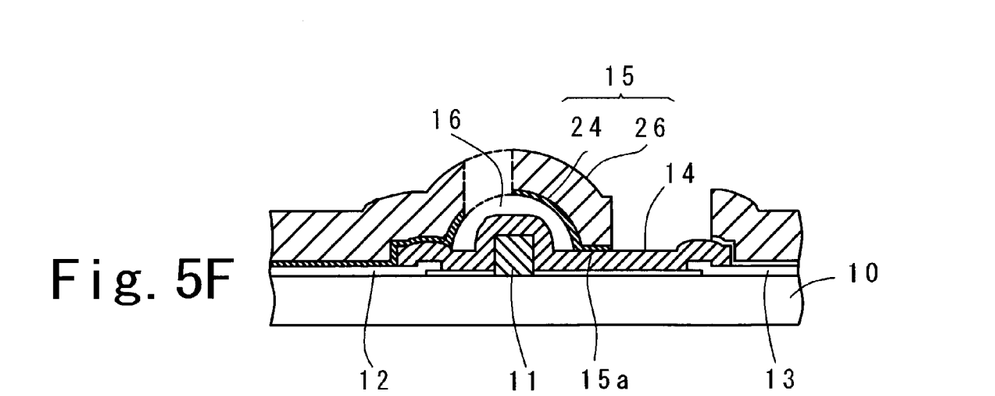
Figure 6:
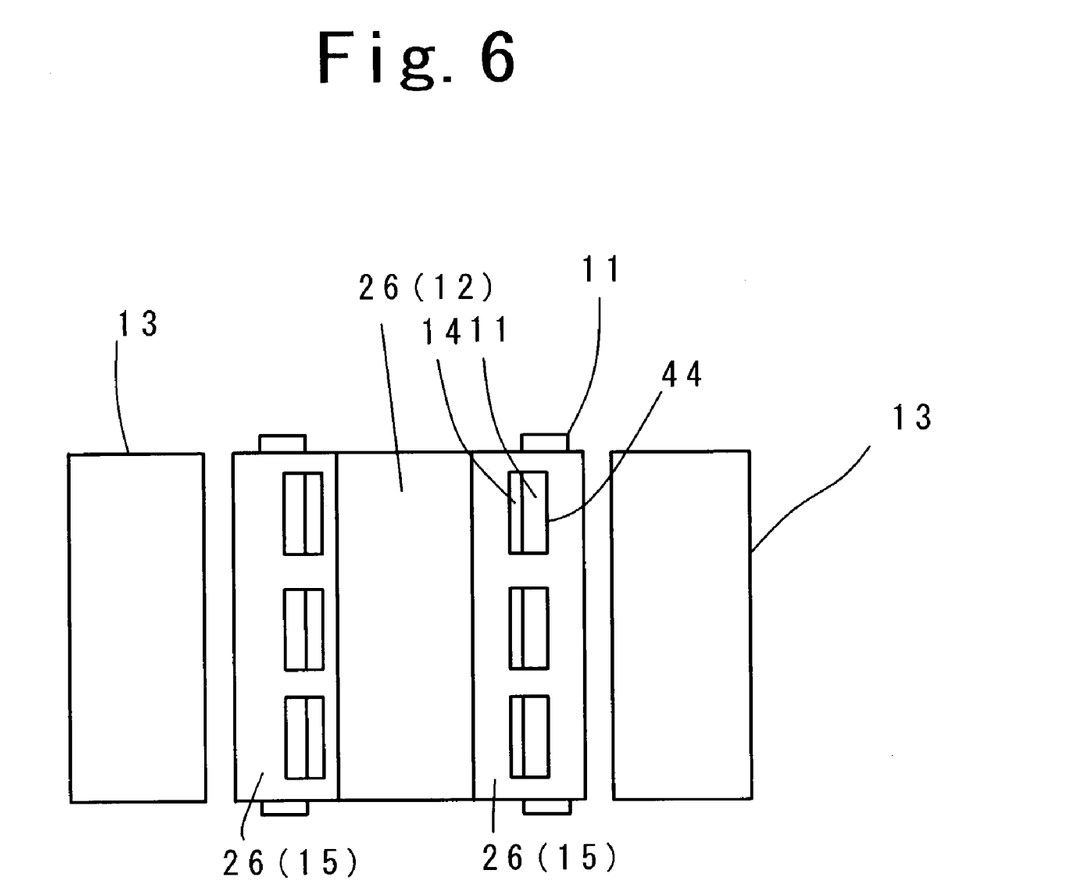
FIG. 6 is a plan view of the device shown in FIG. 5F.

After that, as shown in FIG. 5F, the resist 41 is removed via the window 44. Since the resist 41 has been cured, it is subject to $O_2$ plasma at a temperature higher than that used in normal etching. FIG. 6 is a plan view of the semiconductor device shown in FIG. 5F. The gate electrode 11 covered by the insulating layer 14 can be seen via the window 44 formed in the source wall 15. It is to be noted that FIG. 2C is the cross-sectional view taken along a line that does not run across the windows 44.

In FIG. 5F, the end surface 15a of the source wall 15 is closer than the gate electrode 11 than the drain electrode 13. Alternatively, the end surface 15a of the source wall 15 may be closer to the drain electrode 13 than the gate electrode 11.

It can be seen from the above that the structure of FIG. 2C can be realized by the simple fabrication method. It is to be noted that the source wall 15 having the window 44 may be a factor for making a decision as to whether the process shown in FIGS. 5D through 5E is employed.

In short, the method of fabricating the semiconductor device shown in FIGS. 5A through 5F includes the steps of: (a) forming the insulating layer 14 that covers the gate electrode 11 on the semiconductor substrate 10 and its vicinity; (b) providing the first resist 41 on the semiconductor layer 10 and pattering it; (c) providing a second resist having the first part 43 over the first resist 41 and the second part 25 between the gate electrode 11 and the source electrode 13; (d) forming the conductor layer 26 over the semiconductor substrate 10 so as to connect the source electrode 12; and (e) removing the first and second resists 41, 43, 25 to form the source wall 15 that extends from the source electrode 12 and passes over the gate electrode 15, the end surface 15a of the source wall 15 being interposed between the gate electrode 11 and the drain electrode 13 and being located in a position lower than the top surface of the gate electrode 11.

According to the present invention, there are a semiconductor device having a structure that needs no complex process and has enhanced mechanical strength and reduced inter-electrode parasitic capacitance, and a method of fabricating such a device.

The present invention is based on Japanese patent application no. 2002-098033 filed on Mar. 29, 2002, the entire disclosure of which is hereby incorporated by reference.

The present invention is not limited to the specifically described embodiments, and variations and modifications may be made without departing from the scope of the present invention.

What is claimed is:

1. A semiconductor device comprising:
   a gate electrode on a semiconductor substrate;
   a source electrode and a drain electrode that are provided on the semiconductor substrate, the gate electrode being interposed between the source electrode and the drain electrode; and
   an insulating layer covering the gate electrode, wherein the source electrode includes a layer that passes over the gate electrode from the semiconductor substrate to form a source wall that covers the gate electrode and has a window above apart of the gate electrode, an end surface of the source wall being interposed between the gate electrode and the drain electrode and being located on the insulating layer in a position lower than a top surface of the gate electrode, the window being located closer to the source electrode than the drain electrode.

2. The semiconductor device as claimed in claim 1, wherein the source wall has multiple windows arranged in a line.

3. The semiconductor device as claimed in claim 1, wherein the source wall has a portion that defines a gap surrounded by the insulating layer and the source wall.

4. The semiconductor device according to claim 1, wherein the insulating layer has a step portion along the gate electrode.

5. The semiconductor device according to claim 1, wherein the end surface of the source wall contacts the insulating layer.

6. The semiconductor device according to claim 1, wherein the insulating layer contacts the source electrode, the drain electrode and the gate electrode.

7. The semiconductor device according to claim 1, wherein the insulating layer has a portion located between the gate electrode and the source electrode, and said portion has a top surface lower than the top surface of the gate electrode.

8. The semiconductor device according to claim 1, wherein the insulating layer has a portion located between the gate electrode and the source electrode, and said portion is thinner than the gate electrode.

9. The semiconductor device according to claim 1, wherein the source wall comprises a plurality of layers.

10. The semiconductor device according to claim 1, wherein the source wall and the insulating layer define a gap formed therebetween, and the source wall has a window connected to the gap.

* * * * *